(12) United States Patent
Wang et al.

(10) Patent No.: US 12,495,583 B2
(45) Date of Patent: Dec. 9, 2025

(54) SEMICONDUCTOR ARRANGEMENT AND METHOD OF MANUFACTURE

(71) Applicant: TAIWAN SEMICONDUCTOR MANUFACTURING COMPANY LIMITED, Hsin-Chu (TW)

(72) Inventors: Pei-Yu Wang, Hsinchu (TW); Sai-Hooi Yeong, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 18/536,162

(22) Filed: Dec. 11, 2023

(65) Prior Publication Data

US 2024/0105847 A1 Mar. 28, 2024

Related U.S. Application Data

(63) Continuation of application No. 17/397,035, filed on Aug. 9, 2021, now Pat. No. 11,843,050, which is a
(Continued)

(51) Int. Cl.
| | |
|---|---|
| *H10D 30/69* | (2025.01) |
| *H01L 21/02* | (2006.01) |
| *H10D 30/01* | (2025.01) |
| *H10D 30/62* | (2025.01) |
| *H10D 30/67* | (2025.01) |

(Continued)

(52) U.S. Cl.
CPC ..... *H10D 30/797* (2025.01); *H01L 21/02488* (2013.01); *H01L 21/02529* (2013.01); *H01L 21/02532* (2013.01); *H01L 21/02535* (2013.01); *H10D 30/024* (2025.01); *H10D 30/031* (2025.01); *H10D 30/6211* (2025.01); *H10D 30/6713* (2025.01); *H10D 30/6735* (2025.01); *H10D 30/6757* (2025.01); *H10D 30/792* (2025.01); *H10D 62/021* (2025.01);
(Continued)

(58) Field of Classification Search
CPC .. H10D 30/797; H10D 30/024; H10D 30/031; H10D 30/6221; H10D 30/6713; H10D 30/6735; H10D 30/6757; H10D 30/792; H10D 30/62; H10D 30/014; H10D 30/43; H10D 30/794; H10D 62/021; H10D 62/121; H10D 62/151; H10D 62/822; H01L 21/02488; H01L 21/02529; H01L 21/02532; H01L 21/02535
See application file for complete search history.

(56) References Cited

U.S. PATENT DOCUMENTS 9,293,581 B2 * 3/2016 Yu ........................ H10D 30/601
11,843,050 B2 * 12/2023 Wang ................ H01L 29/78696
(Continued)

*Primary Examiner* — Dao H Nguyen
(74) *Attorney, Agent, or Firm* — Cooper Legal Group, LLC

(57) ABSTRACT

A method for forming a semiconductor arrangement comprises forming a fin over a semiconductor layer. A gate structure is formed over a first portion of the fin. A second portion of the fin adjacent to the first portion of the fin and a portion of the semiconductor layer below the second portion of the fin are removed to define a recess. A stress-inducing material is formed in the recess. A first semiconductor material is formed in the recess over the stress-inducing material. The first semiconductor material is different than the stress-inducing material.

20 Claims, 15 Drawing Sheets

Related U.S. Application Data continuation of application No. 16/577,389, filed on Sep. 20, 2019, now Pat. No. 11,088,281.

(60) Provisional application No. 62/753,176, filed on Oct. 31, 2018.

(51) Int. Cl.
*H10D 62/00* (2025.01)
*H10D 62/10* (2025.01)
*H10D 62/13* (2025.01)
*H10D 62/822* (2025.01)

(52) U.S. Cl.
CPC ......... *H10D 62/121* (2025.01); *H10D 62/151* (2025.01); *H10D 62/822* (2025.01)

(56) References Cited

U.S. PATENT DOCUMENTS

| | | | |
|---|---|---|---|
| 2012/0032240 A1* | 2/2012 | Mayuzumi | H01L 29/7848 257/288 |
| 2013/0043515 A1* | 2/2013 | Huang | H10D 62/116 257/E21.409 |
| 2015/0214345 A1* | 7/2015 | Wan | H10D 48/383 257/104 |
| 2017/0092728 A1* | 3/2017 | Kim | H10D 30/6219 |

* cited by examiner

SEMICONDUCTOR ARRANGEMENT AND METHOD OF MANUFACTURE

PRIORITY CLAIM AND CROSS-REFERENCE

This application is a continuation of and claims priority to U.S. Non-Provisional application Ser. No. 17/397,035, filed on Aug. 9, 2021, which is a continuation of and claims priority to U.S. Non-Provisional application Ser. No. 16/577,389, filed on Sep. 20, 2019, which claims priority to U.S. Provisional Application Ser. No. 62/753,176, filed Oct. 31, 2018. U.S. Non-Provisional application Ser. No. 17/397,035, U.S. Non-Provisional application Ser. No. 16/577,389, and U.S. Provisional Application Ser. No. 62/753,176 are herein incorporated by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET comprises an extended semiconductor fin that is elevated over a substrate in a direction substantially normal to a plane of a top surface of the substrate. A channel of the FinFET is formed in this fin. A gate is provided over and partially wraps the fin. FinFETs can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
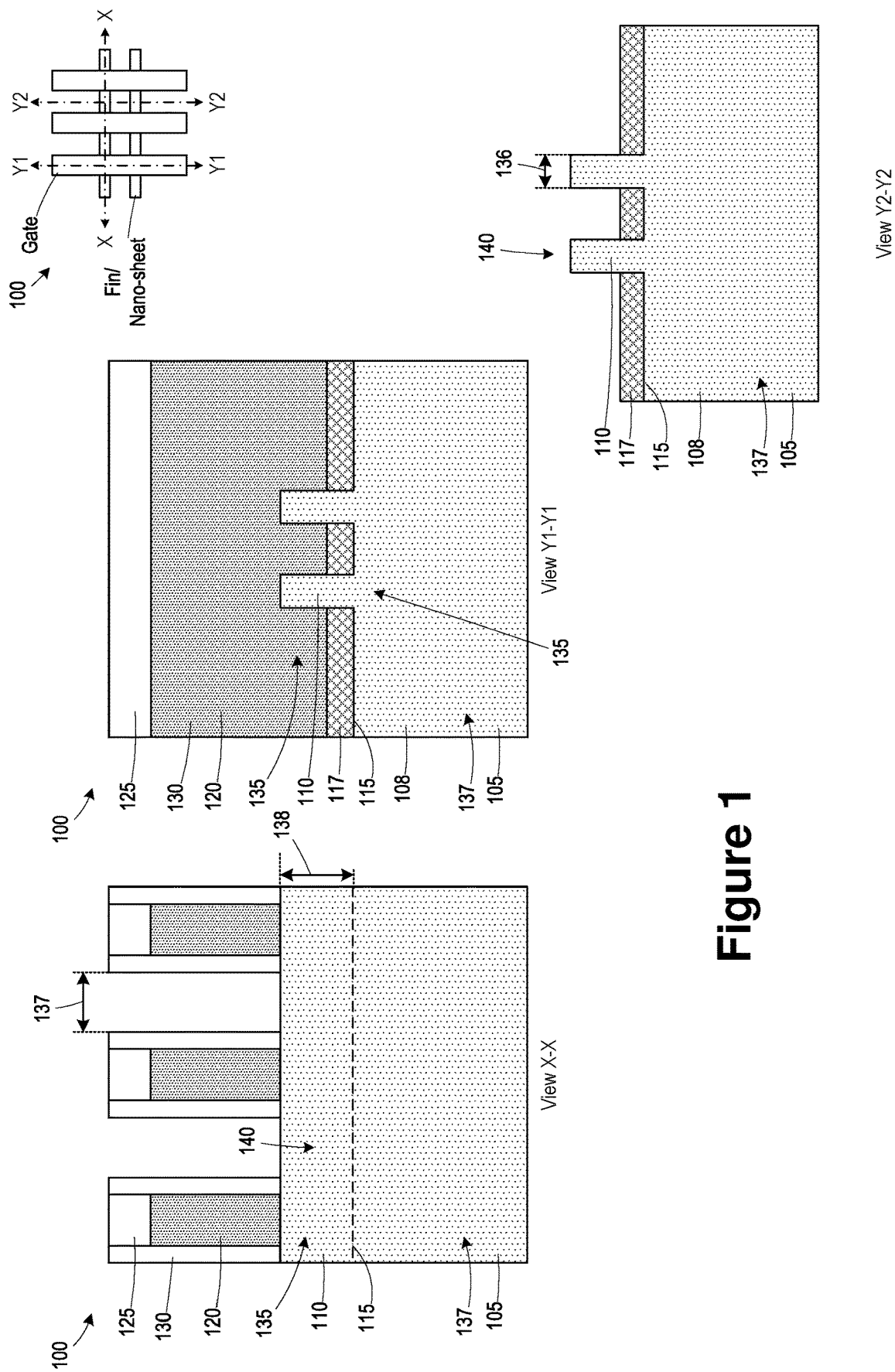
FIGS. 1-12 are illustrations of a semiconductor arrangement at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. According to some embodiments, a stress-inducing material is formed in a recess that extends into a semiconductor layer lower than the fin. The stress-inducing material applies a stress to a channel region of a transistor device. In some embodiments, the stress-inducing material is a dielectric material. In some embodiments, the stress-inducing material is a silicon alloy material.

FIGS. 1-12 are illustrations of a semiconductor arrangement 100 at various stages of fabrication, in accordance with some embodiments. FIGS. 1-12 include a simplistic plan view showing where various cross-sectional views are taken. Referring to FIG. 1, the view X-X is a cross-sectional view taken through the semiconductor arrangement 100 in a direction corresponding to a gate length direction through a fin or nano-sheet, the view Y1-Y1 is a cross-sectional view taken through the semiconductor arrangement 100 in a direction corresponding to a gate width direction through a gate structure, and the view Y2-Y2 is a cross-sectional view taken through the semiconductor arrangement 100 in a direction corresponding to a gate width direction through a source/drain region. Not all aspects of the processing shown in the cross-sectional views will be depicted in the plan view.

Referring to FIG. 1, a plurality of layers used in the formation of the semiconductor arrangement 100 are illustrated, in accordance with some embodiments. In some embodiments, the semiconductor arrangement 100 comprises fin-based transistors, such as FinFET transistors. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon.

In some embodiments, fins 110 are formed over the semiconductor layer 105. In some embodiments, the fins 110 are formed by etching trenches in the semiconductor layer 105 using a patterned hard mask. Thus, the fins 110 are formed from a portion of the semiconductor layer 105 that remains between trenches in the semiconductor layer 105. In some embodiments, the fins 110 are formed, such as grown, over the semiconductor layer 105. In some embodiments, the fins 110 are formed over the semiconductor layer 105 by forming a second semiconductor layer over the semiconductor layer 105 and etching trenches in the second semiconductor layer. In some embodiments, fins that are initially formed in the semiconductor layer 105 are replaced. For example, in some embodiments, the fins are initially defined by forming trenches in the semiconductor layer 105, a dielectric layer is formed between the initially formed fins and planarized to expose upper surfaces of the initially formed fins, an etch process is performed to remove at least portions of the initially formed fins, and a growth process is performed to form replacement fins with one or more different material characteristics compared to the initially formed fins, such as a different silicon alloy material, a different dopant concentration, etc. In some embodiments, a dopant type and/or dopant concentration in the semiconductor layer 105 is different than a dopant type and/or dopant concentration in the fins 110. An interface 115 is defined between the fins 110 and the semiconductor layer 105 at an uppermost surface of the semiconductor layer 105. According to some embodiments, the fins 110 define an active region for forming devices, such as FinFET transistors. In some embodiments, an isolation structure 117, such as shallow trench isolation (STI), is formed by depositing a dielectric layer between the fins 110 and recessing the dielectric layer to re-expose a portion of a sidewall of the fins 110. In some embodiments, the isolation structure 117 comprises silicon and oxygen or other suitable dielectric materials.

In some embodiments, gate structures 120 are formed over the fins 110. In some embodiments, the gate structures 120 comprise a first gate insulation layer and a sacrificial gate electrode. In some embodiments, the first gate insulation layer comprises silicon and oxygen. In some embodiments, the first gate insulation layer comprises a high-k dielectric material. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3, and each value of y is independently from 0 to 2.

In some embodiments, the first gate insulation layer comprises a native oxide layer formed by exposure of the semiconductor arrangement 100 to oxygen at various points in the process flow, causing the formation of silicon dioxide on exposed surfaces of the fins 110. According to some embodiments, the gate structures 120 are formed by forming a layer of sacrificial electrode material and a hard mask layer over the fins 110. In some embodiments, a patterning process is performed to pattern the hard mask layer corresponding to the pattern of gate structures to be formed, and an etch process is performed using the patterned hard mask layer to etch the sacrificial electrode layer to define the gate structure 120. In some embodiments, the sacrificial electrode material comprises polysilicon. In some embodiments, remaining portions of the hard mask layer form a cap layer 125 over the gate structure 120.

In some embodiments, sidewall spacers 130 are formed adjacent the gate structures 120. In some embodiments, the sidewall spacers 130 are formed by depositing a conformal spacer layer over the gate structures 120 and performing an anisotropic etch process to remove portions of the spacer layer positioned on horizontal surfaces of the cap layer 125, the fins 110, and the semiconductor layer 105. In some embodiments, the sidewall spacers 130 comprise the same material composition as the cap layer 125. In some embodiments, the sidewall spacers 130 comprises nitrogen and silicon. In some embodiments, the gate structures 120 are formed over first portions 135 of the fin 110 and first portions 135 of the semiconductor layer 105, and second portions 140 of the fins 110 are exposed between the gate structures 120 and sidewall spacers 130. In some embodiments, the first portions 135 of the fin 110 comprise channel portions. In some embodiments, a width 136 of the fins 110 is about 10-20 nm. In some embodiments, a spacing 137 between the fins 110 including the sidewall spacers 130 is about 15-30 nm. In some embodiments, an initial height 138 of the fins 110 above the interface 115 is about 40-60 nm.

Figure 2:
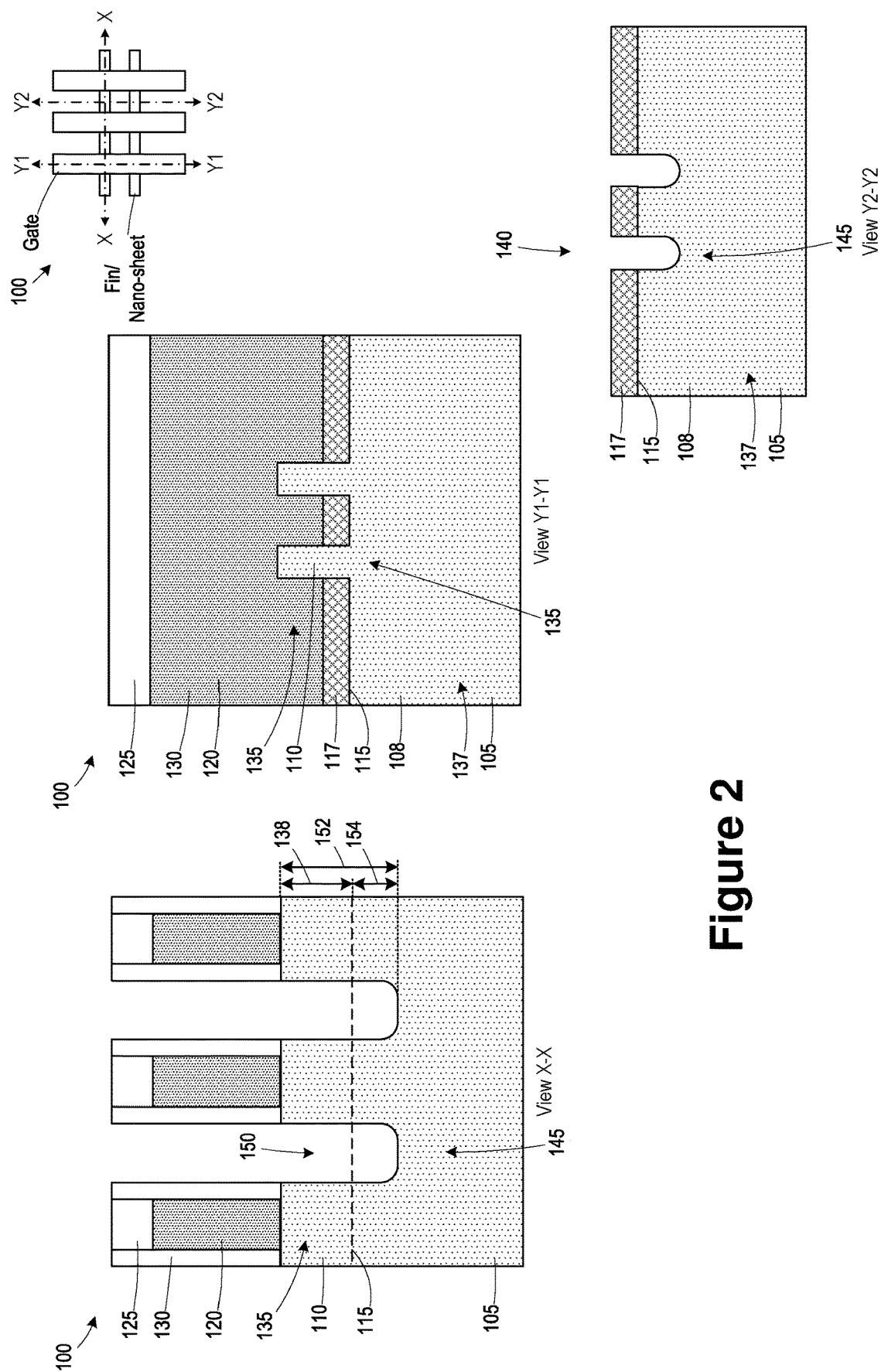

Referring to FIG. 2, the second portions 140 of the fins 110 and portions 145 of the semiconductor layer 105 under the second portions 140 of the fins 110 are removed to form recesses 150 that extend into the semiconductor layer 105 below the interface 115, in accordance with some embodiments. In some embodiments, an etch process is performed to remove the second portions 140 of the fins 110 and the portions 145 of the semiconductor layer 105 under the second portions 140 of the fins 110. In some embodiments, the etch process is a timed etch process, where the time is selected to provide a depth for the recesses 150 that extends below the interface 115 and into the semiconductor layer 105. In some embodiments, the etch process employs an etch chemistry using $CH_4$ or other suitable etchants. In some embodiments, a depth 152 of the recesses 150 relative to an upper surface of the fins 110 is about 60-90 nm. In some embodiments, a depth 154 of the recesses 150 relative to the interface 115 is about 20-50 nm. In some embodiments, if the depth 154 of the recesses 150 relative to the interface 115 is greater than 50 nm, processing issues may occur during the manufacturing process. For example, if the depth 154 of the recesses 150 relative to the interface 115 is greater than 50 nm, the fins 110 may be subject to forces that cause the fins 110 to bend or tilt during manufacturing and result in the fins 110 being damaged. If the depth 154 of the recesses 150 relative to the interface 115 is less than 20 nm, an insufficient amount of stress-inducing material 160 may be formed below the fins (as described in FIGS. 3-4), resulting in an insufficient amount of stress being induced in the fins 110.

Figure 3:
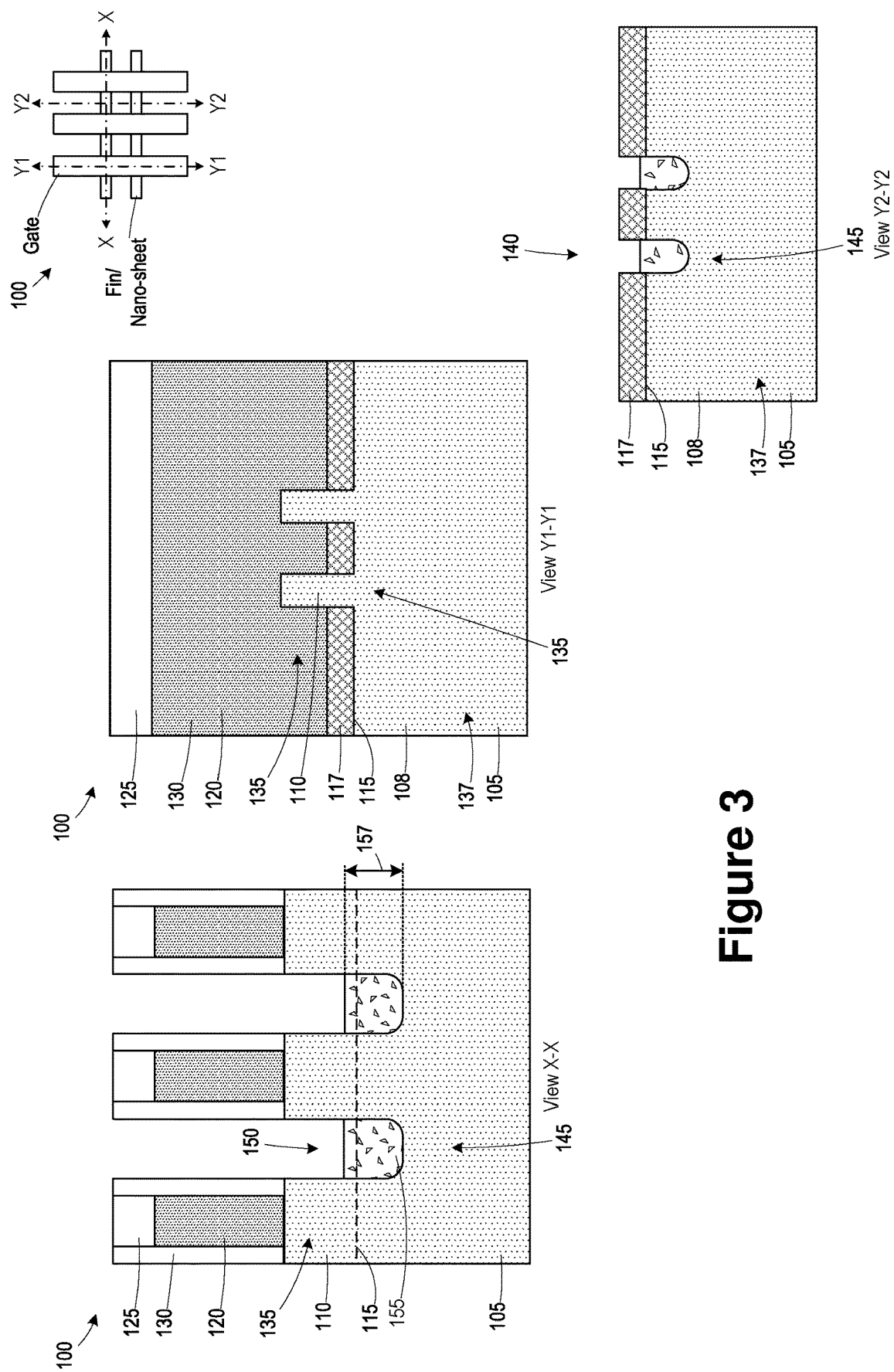

Referring to FIG. 3, a dielectric material 155 is formed in the recess 150, in accordance with some embodiments. In some embodiments, a deposition process is performed to form the dielectric material 155. The dielectric material 155 is adjacent the first portion 135 of the fin 110. In some embodiments, the dielectric material 155 extends over the interface 115. In some embodiments, an uppermost surface of the dielectric material 155 is positioned at a height higher than the interface 115. In some embodiments, a spin-on deposition process is performed to form the dielectric material 155. In some embodiments, the dielectric material 155 comprises silicon and nitrogen. In some embodiments, the dielectric material 155 comprises silicon and oxygen. In some embodiments, the dielectric material 155 comprises other suitable dielectric materials. In some embodiments, a height 157 of the dielectric material 155 from the bottom of the recesses 150 to an upper surface of the dielectric material 155 is about 10-30 nm. In some embodiments, the height 157 of the dielectric material 155 is controlled to be 10-30 nm so that the dielectric extends above the bottom of the fins 110 (i.e., extends above the interface 115) by less than 10 nm. In this way, when a first semiconductor material 165 is formed in the recess 150, as described with respect to FIG. 5, over the dielectric material 155 (after the dielectric material 155 is transformed into the stress-inducing material 160 as described with respect to FIG. 4), a distance between a bottom of the first semiconductor material 165 and the bottom of the fins 110 is minimized to enable current to flow from the first semiconductor material 165 to the bottom of the fins 110. If the distance between the bottom of the first semiconductor material 165 and the bottom of the fins 110 is too great, device performance may be impacted or reduced due to resistance caused by the stress-inducing material 160, thereby impacting current flow from the first semiconductor material 165 to the bottom of the fins 110.

According to some embodiments, the dielectric material 155 comprises a stress-inducing material that exerts stress on the first portions 135 of the fin 110 in the as-deposited state of the dielectric material 155. In some embodiments, a deposition process is performed to at least partially fill the recess 150 and an etch process is performed to remove a portion of the dielectric material 155 from the recess 150. In some embodiments, the dielectric material 155 that stress in the as-deposited state comprises silicon and at least one of carbon or nitrogen. In some embodiments, the dielectric material 155 comprises $SiO_x$, $SiN_x$, $SiON_x$, SiOCN, or other suitable material.

Figure 4:
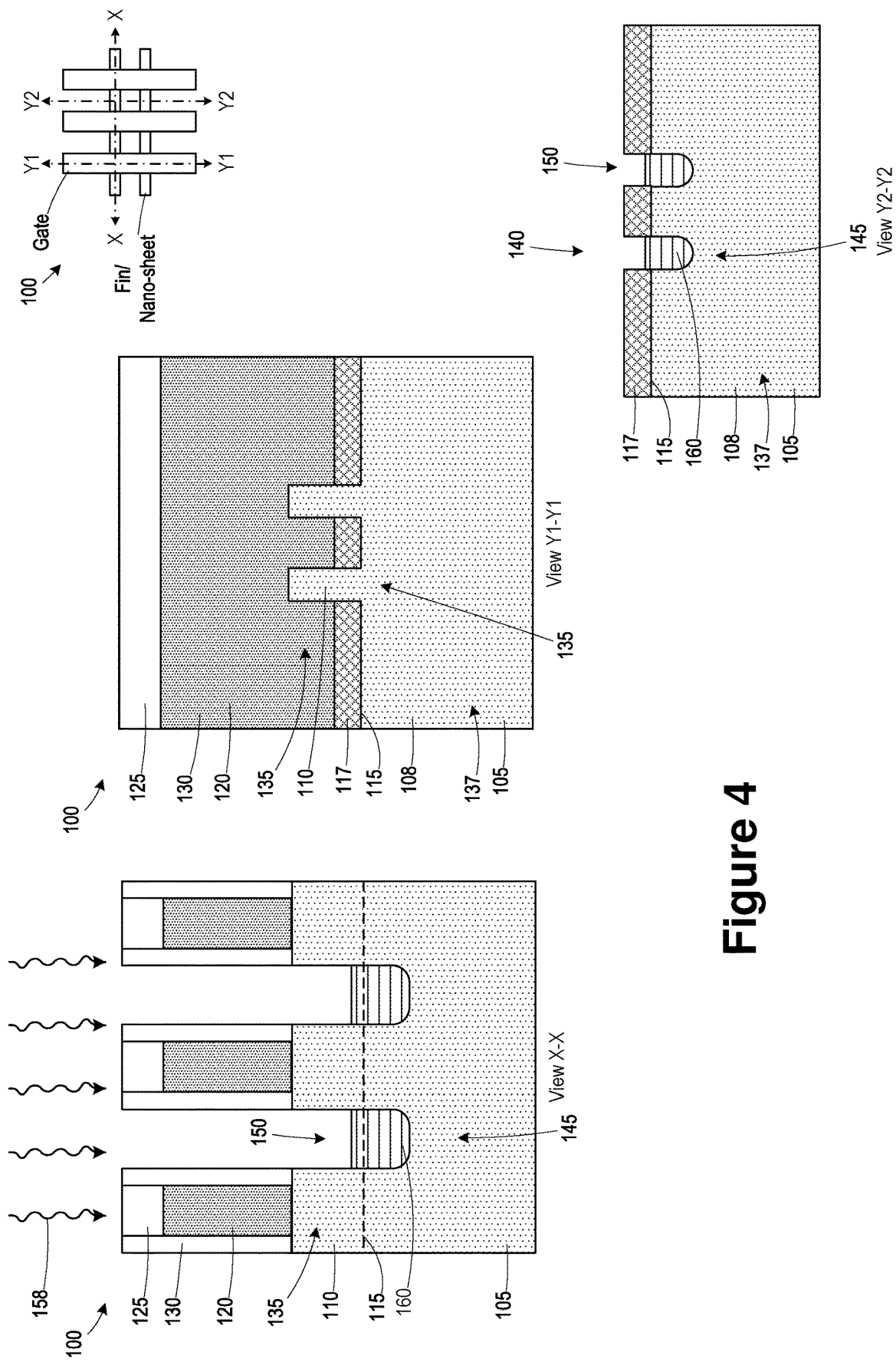

In some embodiments, the dielectric material 155 comprises a porous material that does not induce stress in the as-deposited state of the dielectric material 155. In some embodiments, the porous material comprises silicon and at least one of oxygen or nitrogen. In some embodiments, the dielectric material 155 comprises $SiO_x$, $SiN_x$, $SiON_x$, SiOCN, or other suitable material. Referring to FIG. 4, an anneal process 158 is performed to shrink the dielectric material 155, in accordance with some embodiments, such as in embodiments where the dielectric material 155 comprises a porous material that does not induce stress in the as-deposited state of the dielectric material 155. The shrinking of the dielectric material 155 creates a stress-inducing material 160 that exerts tensile stress on the first portions 135 of the fin 110. In some embodiments, the anneal process 158 is not performed when the dielectric material 155 comprises a stress-inducing material in the as-deposited state of the dielectric material 155. In some embodiments, a temperature of the anneal process is between about 400° C. and 1700° C. In some embodiments, the stress-inducing material 160 exerts about at least 1.5 GPa. In some embodiments, by exerting at least 1.5 GPa of compressive stress on the first portions 135 of the fin 110, hole mobility is increased, and thus performance of P-type transistors is increased. In some embodiments, by exerting at least 1.5 GPa of tensile stress on the first portions 135 of the fin 110 carrier mobility is increased, and thus performance of N-type transistors is increased.

Figure 5:
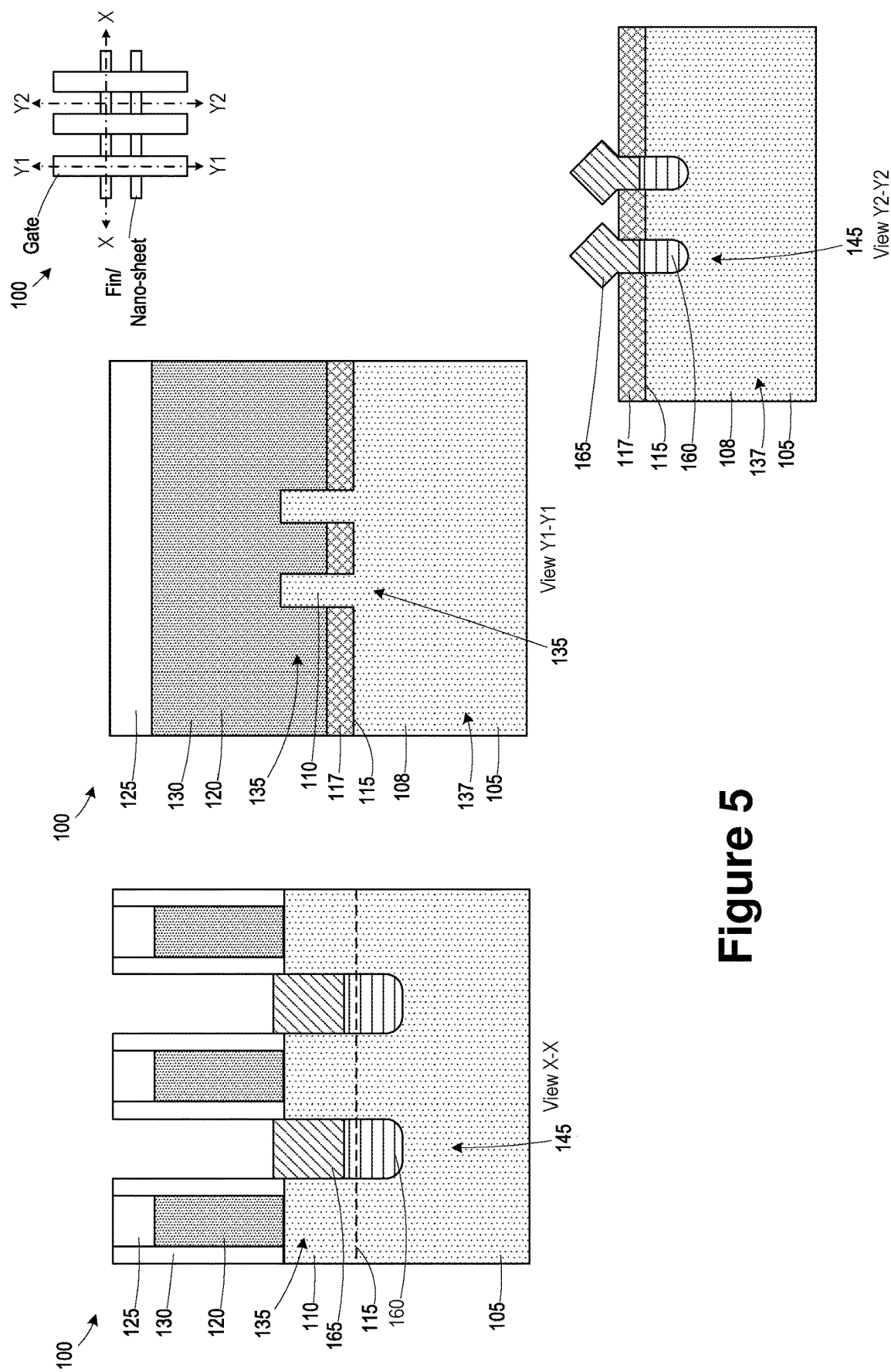

Referring to FIG. 5, a first semiconductor material 165 is formed in the recess 150 over the dielectric material 155, in accordance with some embodiments. In some embodiments, a deposition process is performed to form the first semiconductor material 165. In some embodiments, the deposition process comprises an epitaxial growth process. In some embodiments, such as where the stress-inducing material comprises an oxide or a nitride, the first semiconductor material 165 may be formed via an epitaxial growth process in which the first semiconductor material 165 grows laterally from sidewalls of the fins 110. According to some embodiments, the first semiconductor material 165 defines a portion of a source/drain region. In some embodiments, an upper surface of the first semiconductor material 165 extends beyond an upper surface of the fin 110 and an upper surface of the isolation structure 117.

Figure 6:
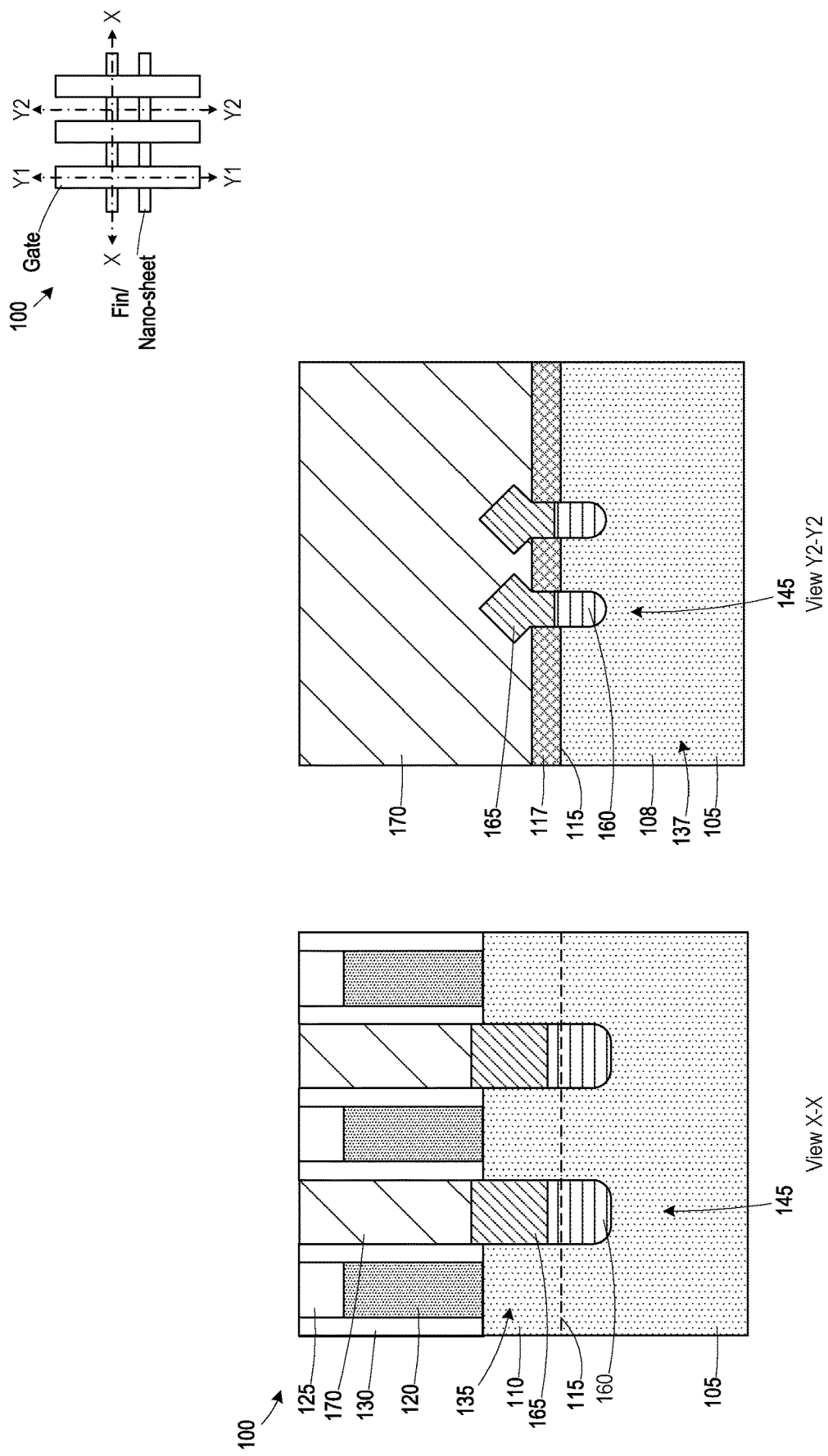

Referring to FIG. 6, a dielectric layer 170 is formed over the first semiconductor material 165. In some embodiments, a deposition process is performed to form the dielectric layer 170. In some embodiments, the dielectric layer 170 is planarized to expose the cap layer 125. In some embodiments, the dielectric layer 170 comprises silicon dioxide or a low-k material. In some embodiments, the dielectric layer 170 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. The materials for the dielectric layer 170 comprise at least one of Si, O, C, or H, such as SiCOH and SiOC, or other suitable materials. Organic material such as polymers may be used for the dielectric layer 170. In some embodiments, the dielectric layer 170 comprises one or more layers of a carbon-containing material, organo-silicate glass, a porogen-containing material, or combinations thereof. The dielectric layer 170 may also comprise nitrogen in some embodiments. The dielectric layer 170 may be formed by using, for example, at least one of plasma-enhanced chemical vapor deposition (PECVD), low pressure CVD (LPCVD), atomic layer CVD (ALCVD), or a spin-on technology. In some embodiments where the dielectric layer 170 is formed using PECVD, the dielectric layer 150 170 is deposited at a substrate temperature in a range of about 25° C. to about 400° C. and at a pressure of less than 100 Torr.

Figure 7:
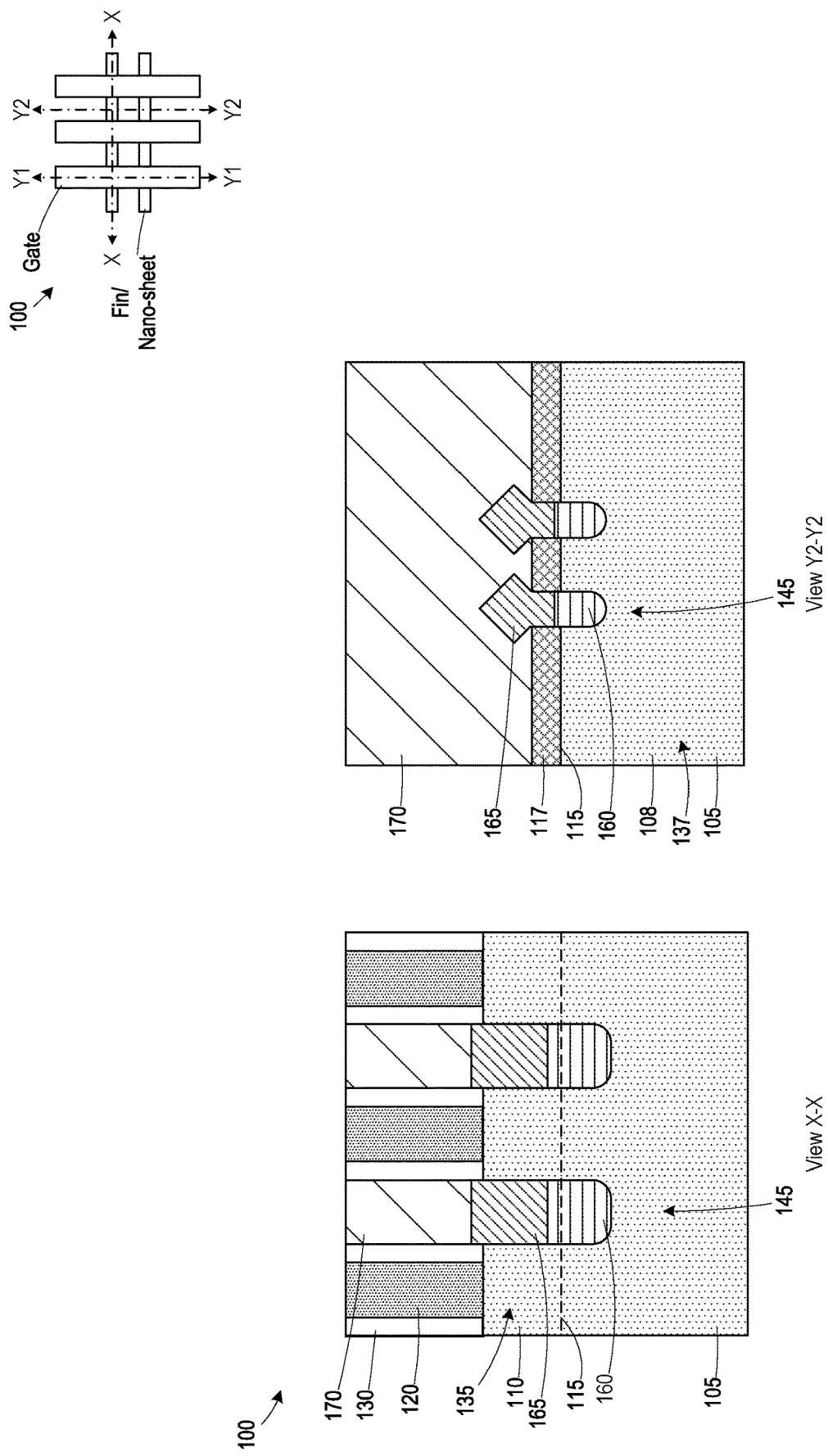

Referring to FIG. 7, the cap layers 125 are removed and heights of the sidewall spacers 130 and the dielectric layer 170 are reduced, in accordance with some embodiments. In some embodiments, a planarization process is performed to remove cap layers 125 and reduce the heights of the sidewall spacers 130 and the dielectric layer 170. In some embodiments, the planarization process exposes the gate structures 120. In some embodiments, the planarization process is a continuation of the process performed to planarize the dielectric layer 170.

Figure 8:
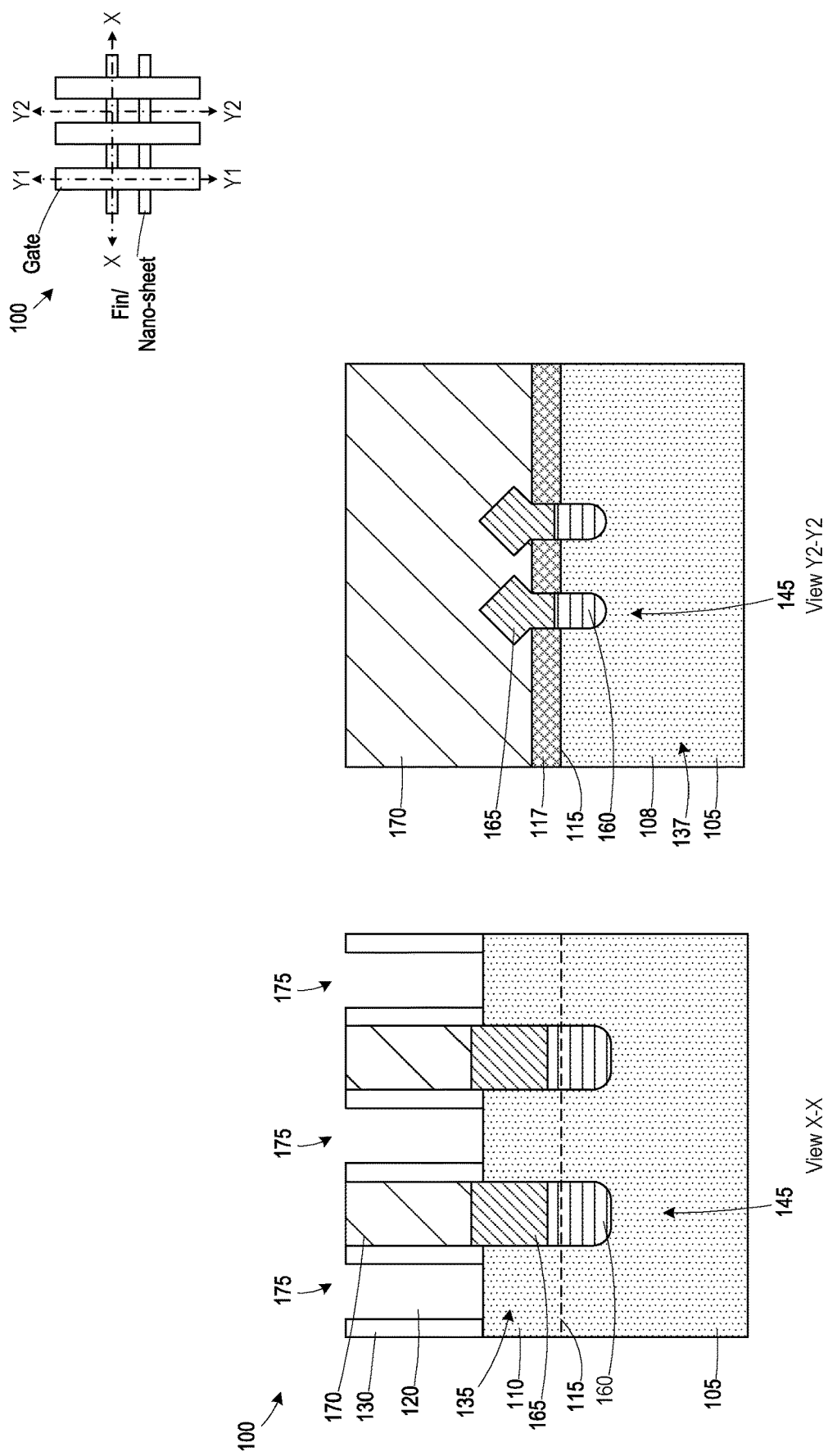

Referring to FIG. 8, the gate structures 120, including the first gate dielectric layer and the sacrificial gate electrode, are removed to define gate cavities 175 and expose portions of the fins 110, in accordance with some embodiments. In some embodiments, one or more etch processes are performed to remove the gate structures 120. In some embodiments, the one or more etch processes comprise one or more wet etch processes selective to the materials of the gate structures 120. In some embodiments, merely a portion of the gate structures 120, such as the sacrificial gate electrode, are removed to define the gate cavities 175. In some embodiments, the first gate dielectric layer is not removed and portions of the fins 110 are not exposed when the portion of the gate structures 120 are removed.

Figure 9:
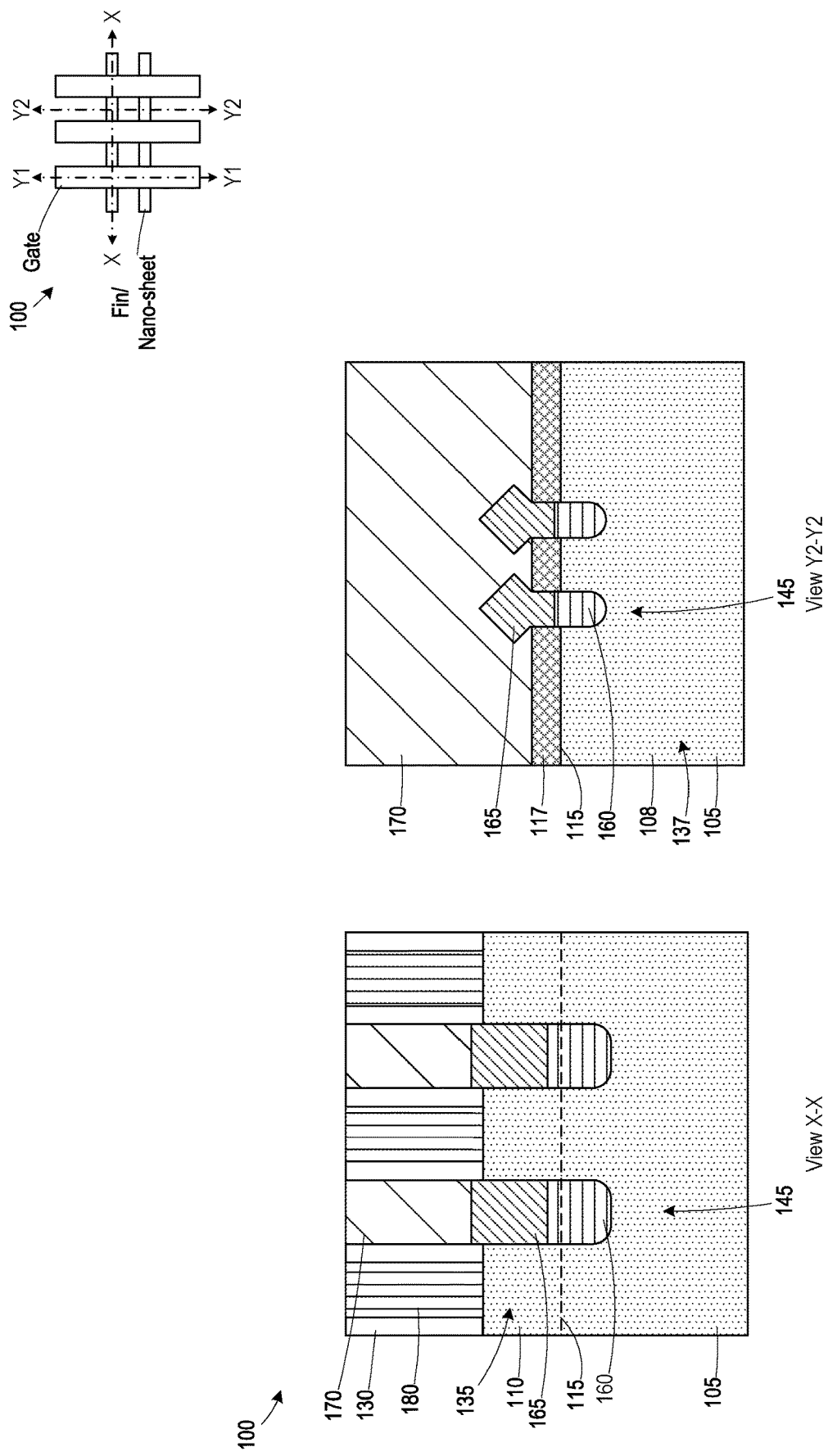

Referring to FIG. 9, replacement gate structures 180 are formed in the gate cavities 175, in accordance with some embodiments. In some embodiments, the replacement gate structures 180 comprise a gate dielectric layer, a gate electrode layer, and other suitable layers. In some embodiments, the first gate dielectric layer is the gate dielectric layer comprised within the replacement gate structures 180. In some embodiments, the gate dielectric layer comprises a high-k dielectric material. In some embodiments, the gate electrode layer comprises a metal fill layer. In some embodiments, the replacement gate structures 180 comprise a conductive work function material layer formed over the gate dielectric layer, and the metal fill layer is formed over the work function material layer. In some embodiments, the work function material layer comprises a p-type work function material layer, such as at least one of TiN, TaN, Ru, Mo, Al, WN, $ZrSi_2$, $MoSi_2$, $TaSi_2$, $NiSi_2$, WN, or other suitable p-type work function materials. In some embodiments, the work function material layer comprises an n-type work function metal, such as at least one of Ti, Ag, TaAl, TaAlC, TiAlN, TaC, TaCN, TaSiN, Mn, Zr, or other suitable n-type work function materials. In some embodiments, the work function material layer comprises a plurality of layers. In some embodiments, the metal fill layer comprises tungsten (W) or other suitable material. In some embodiments, the gate dielectric layer, gate electrode layer, and other suitable layers of the replacement gate structures 180 are deposited by at least one of atomic layer deposition (ALD), physical vapor deposition (PVD), chemical vapor deposition (CVD), or other suitable processes. According to some embodiments, a planarization process is performed to remove portions of the material forming the replacement gate structures 180 positioned over the dielectric layer 170.

Figure 10:
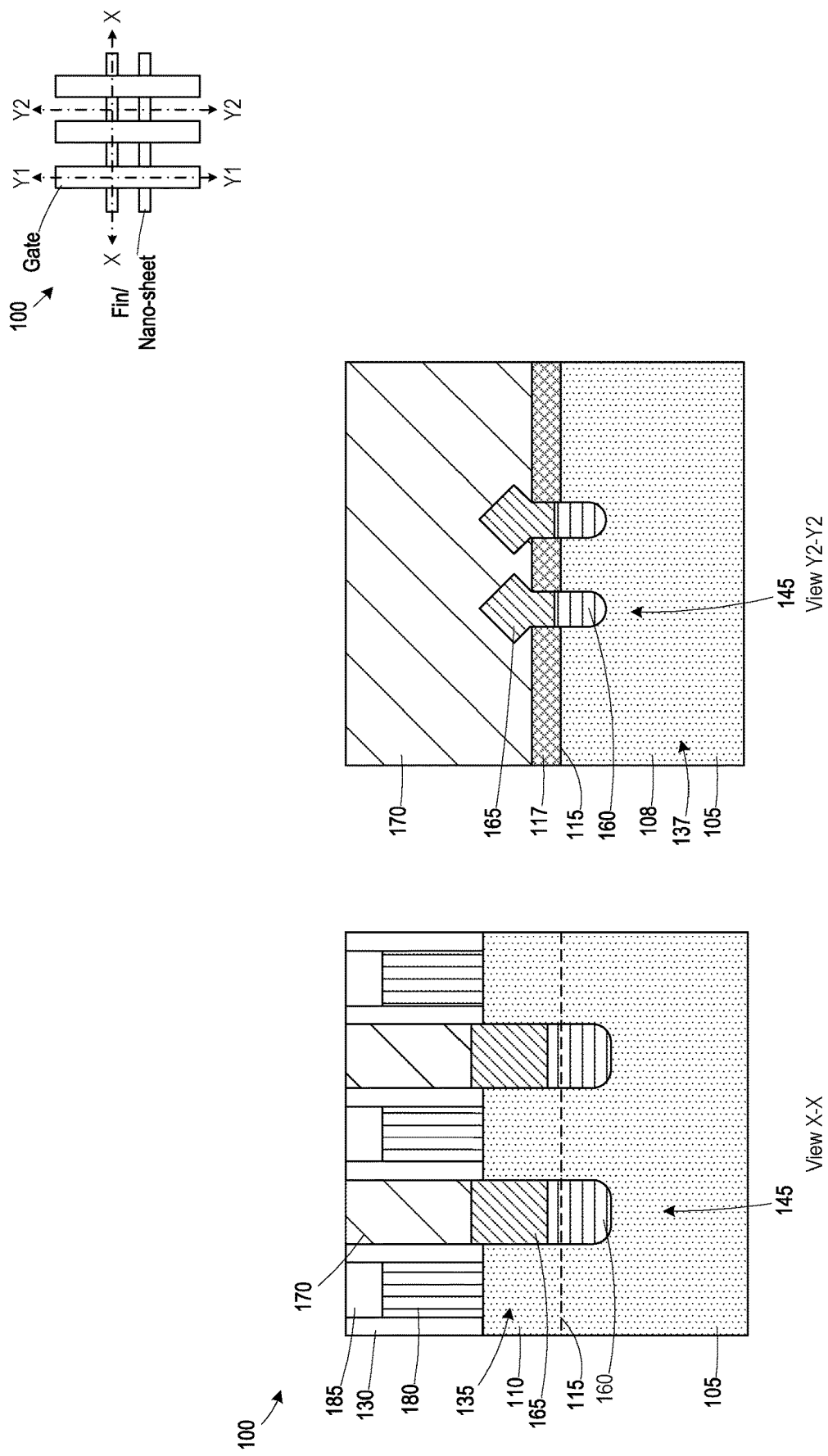
Figure 11:
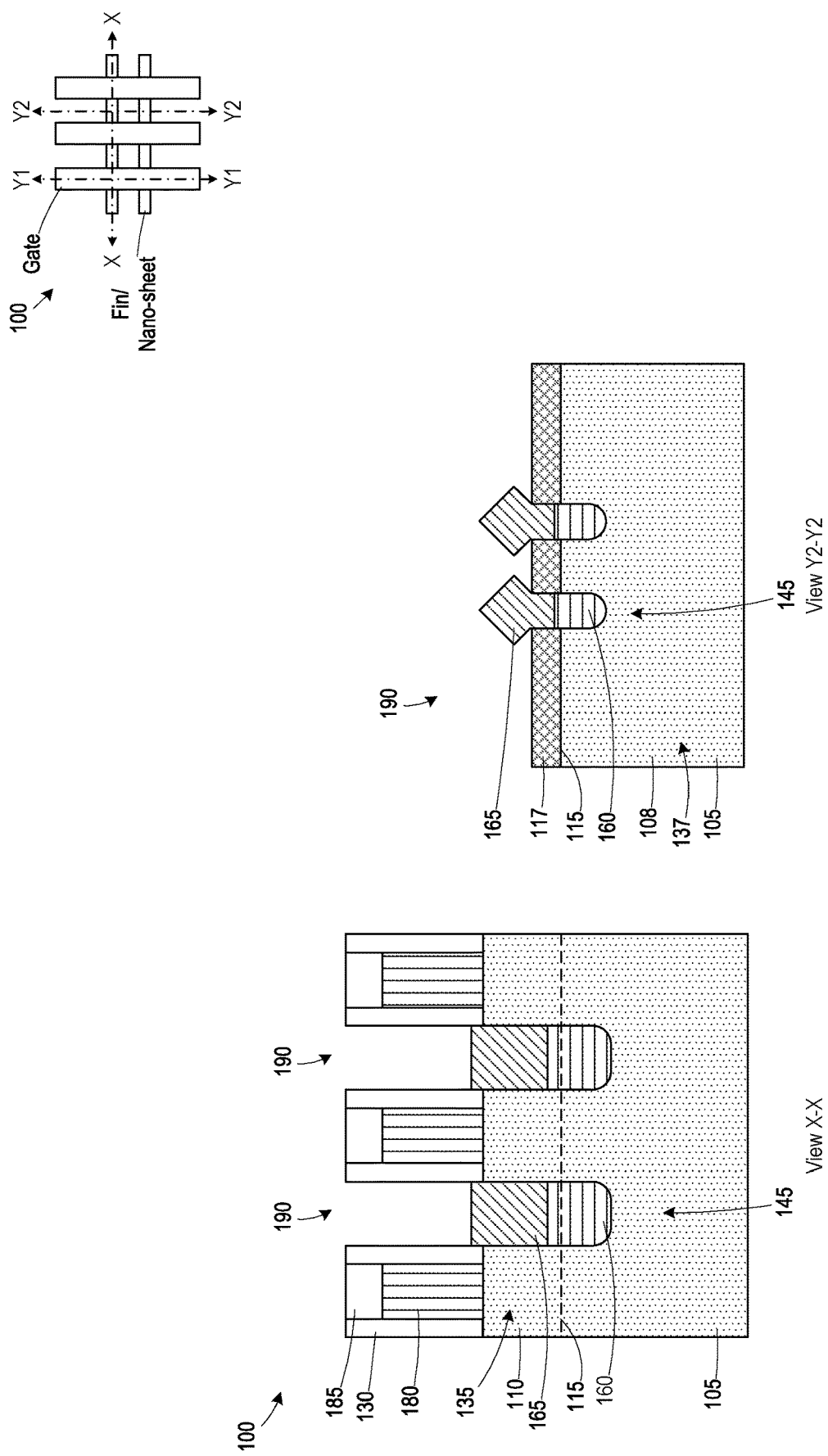

Referring to FIG. 10, the replacement gate structures 180 are recessed and cap layers 185 are formed over the replacement gate structure 180, in accordance with some embodiments. In some embodiments, the replacement gate structures 180 are recessed using an etch process. In some embodiments, the cap layers 185 are formed using a deposition process. In some embodiments, the cap layers 185 comprise dielectric materials. In some embodiments, the cap layers 185 comprise silicon and nitrogen, silicon and oxygen, or other suitable materials. In some embodiments, the cap layers 185 comprise the same material as the sidewall spacers 130. Referring to FIG. 11, contact openings 190 are formed in the dielectric layer 170 to expose portions of underlying first semiconductor material 165, in accordance with some embodiments. In some embodiments, a patterned etch mask is formed to expose portions of the dielectric layer 170 where the contact openings 190 are to be formed. In some embodiments, an etch process is performed using the patterned etch mask to remove portions of the dielectric layer 170.

Figure 12:
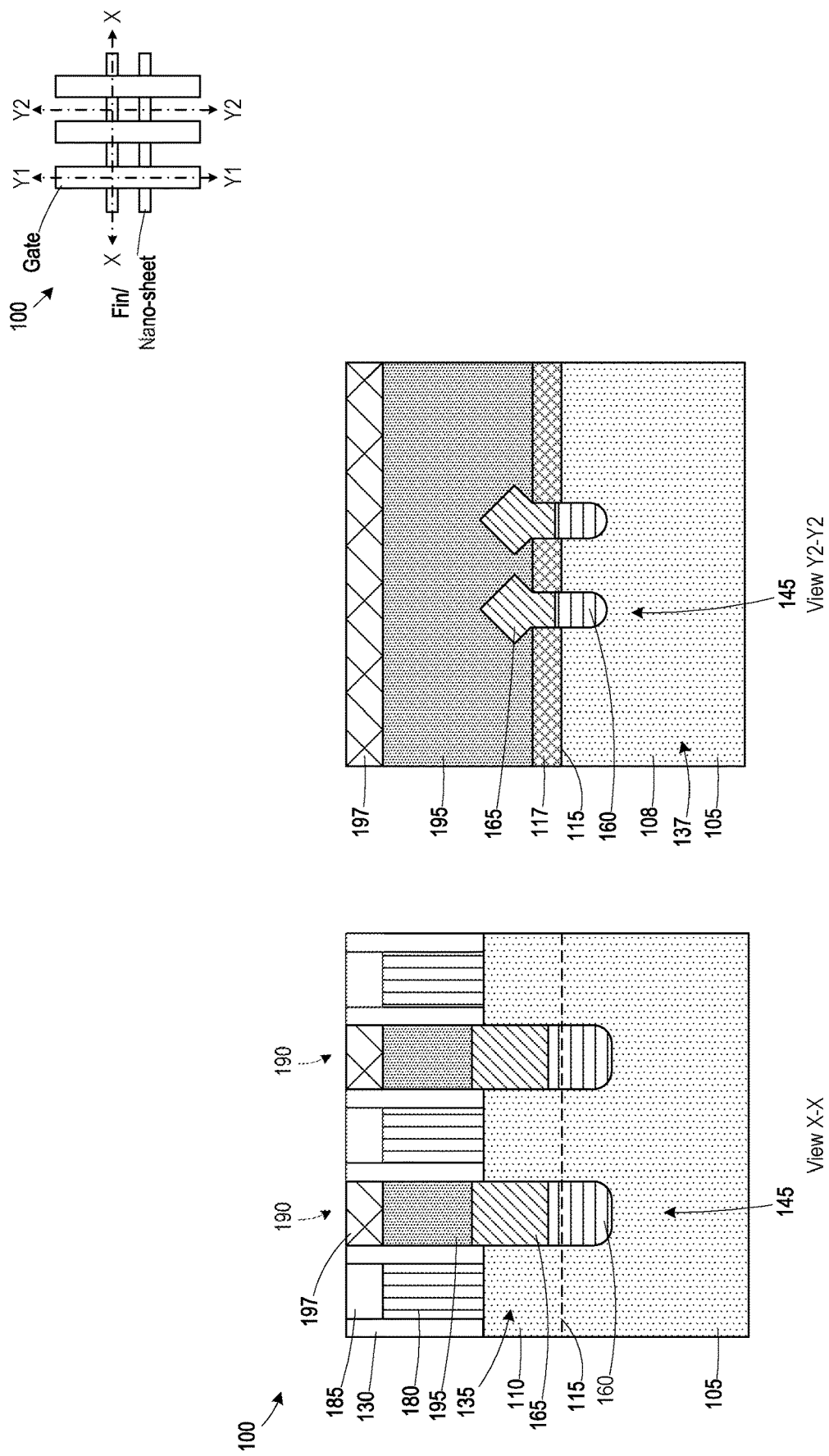

Referring to FIG. 12, source/drain contacts 195 are formed in the contact openings 190, in accordance with some embodiments. In some embodiments, a deposition process is performed to form the source/drain contacts 195. In some embodiments, the source/drain contacts 195 comprise a metal silicide. In some embodiments, source/drain contacts 195 are line-type structures that extend for substantially the entire length of the active region in a direction that corresponds to the gate width direction of the devices. In some embodiments, an etch process is performed to recess the source/drain contacts 195, and a deposition process is performed to form cap layers 197 above the recessed source/drain contacts 195. In some embodiments, the cap layers 197 comprise a material different than the cap layers 185.

According to some embodiments, an additional dielectric layer is formed over the dielectric layer 170 and additional processing is performed to form contacts embedded in the additional dielectric layer and contacting the replacement gate structures 180 and the source/drain contacts 195, in accordance with some embodiments. In some embodiments, the different materials of cap layers 185, 197 provide etch electivity to allow a selected replacement gate structure 180 or a selected source/drain contact 195 to be exposed without exposing the adjacent replacement gate structure 180 or source/drain contacts 195 to avoid forming a gate-to-source/drain short.

According to some embodiments, the replacement gate structure 180, fin 110, and first semiconductor material 165 comprise portions of a transistor. The type of stress generated by the dielectric material 155 or the stress-inducing material 160 depends on the conductivity type of the transistor. Exerting compressive stress on the first portions 135 of the fin 110 increases hole mobility and increases performance of P-type transistors. Exerting tensile stress on the first portions 135 of the fin 110 increases carrier mobility and increases performance of N-type transistors.

Figure 13:
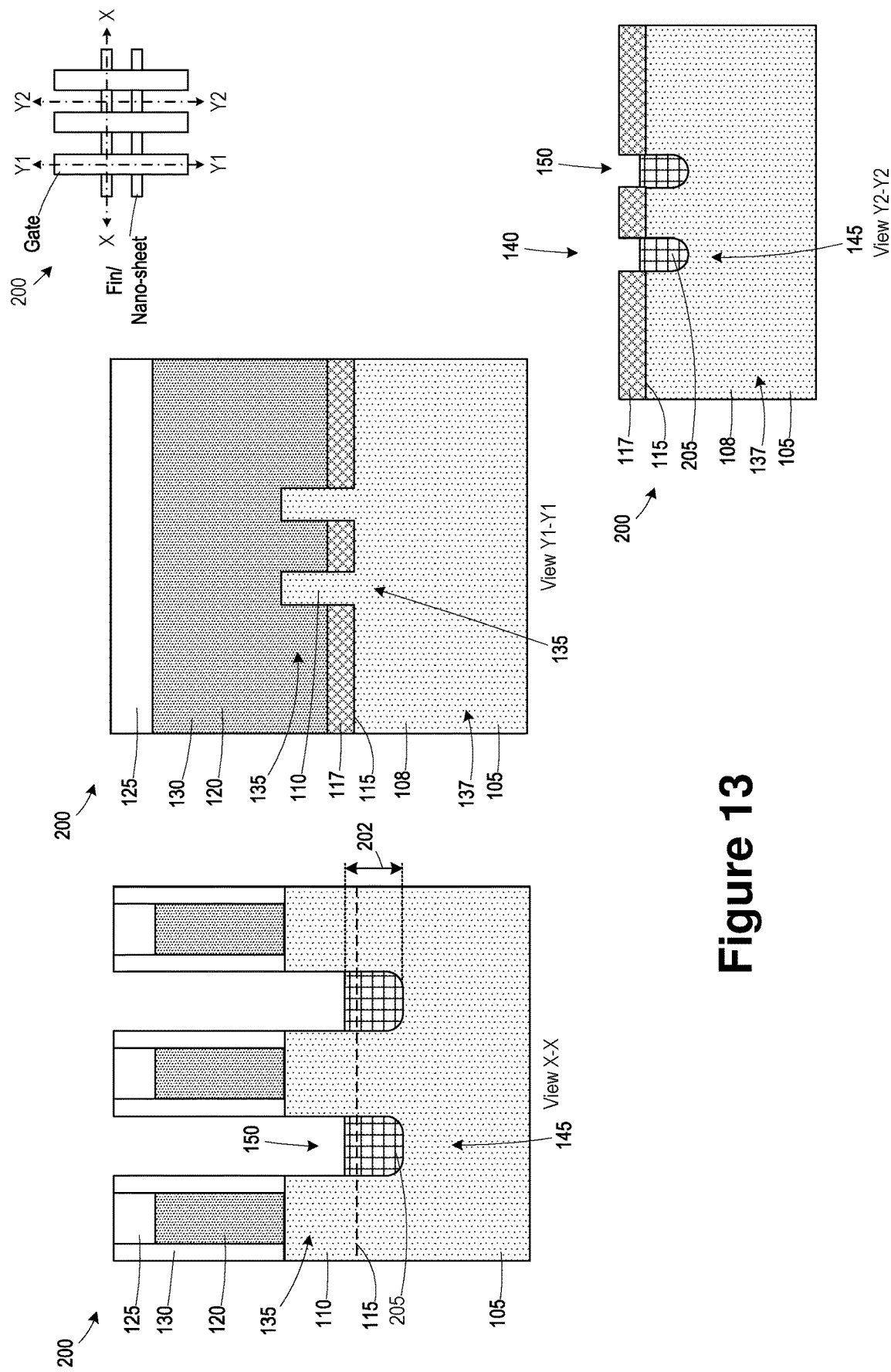
FIGS. 13-15 are illustrations of a semiconductor arrangement at various stages of fabrication, in accordance with some embodiments.
Figure 14:
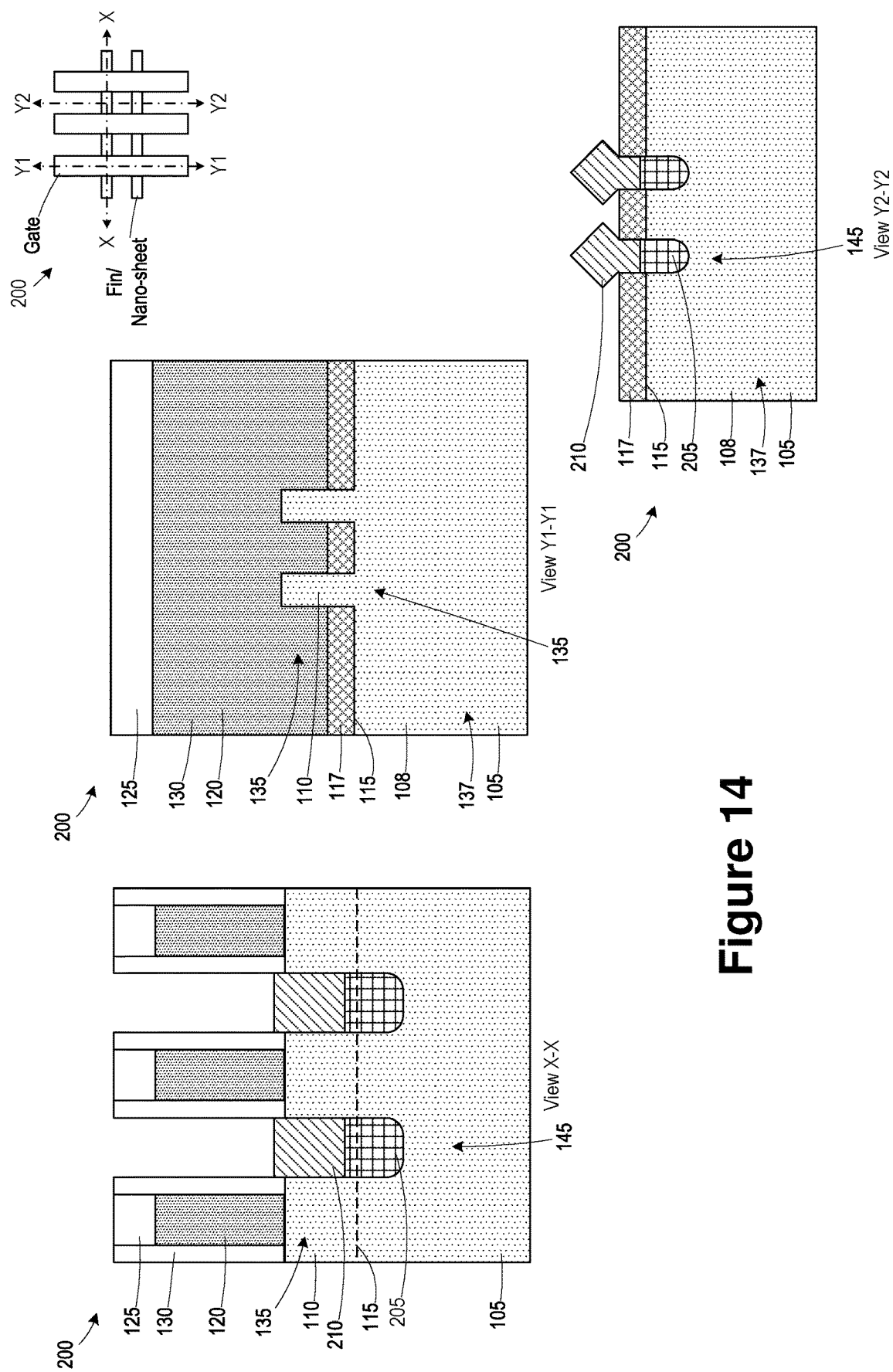
Figure 15:
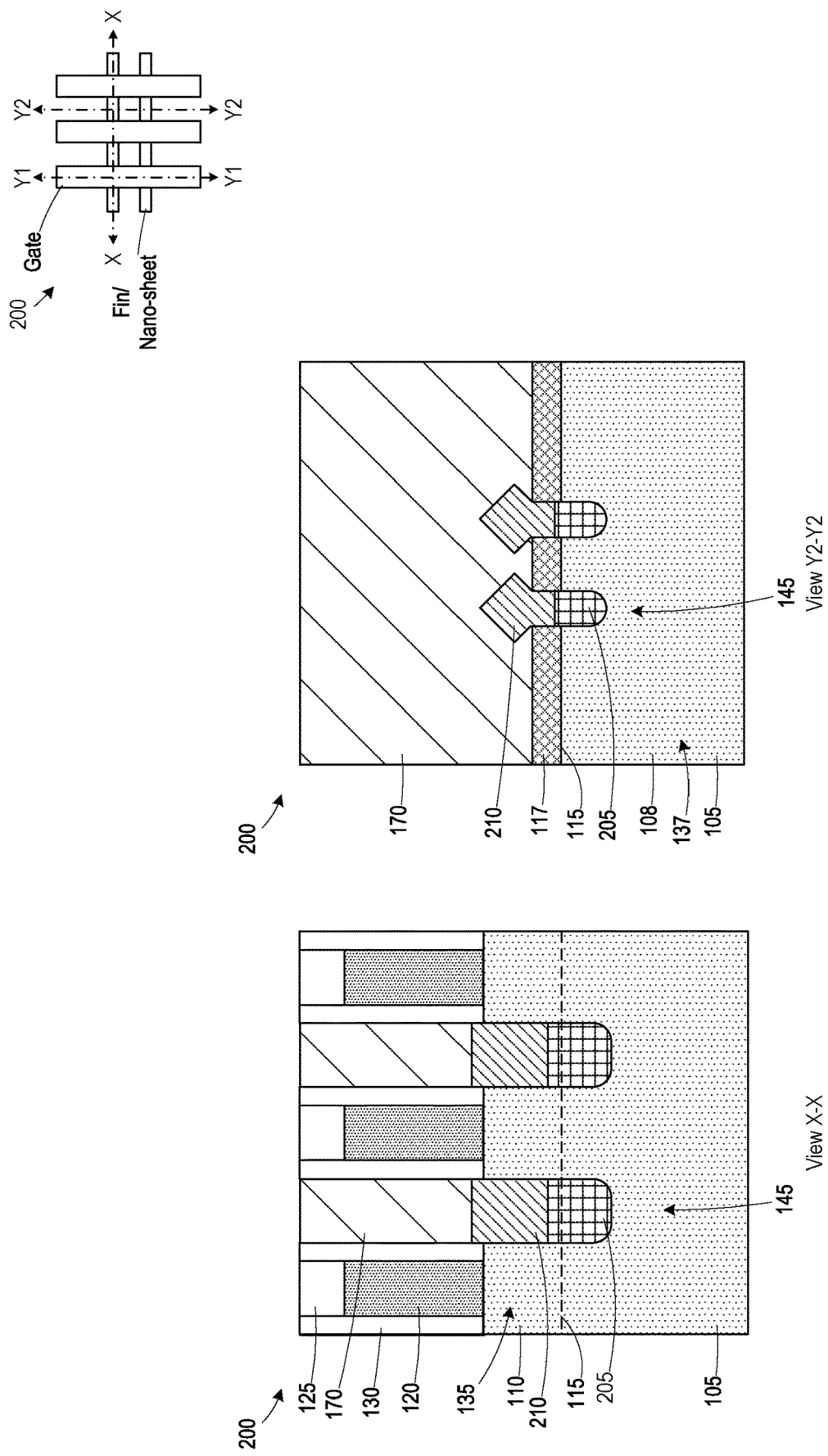

FIGS. 13-15 are illustrations of a semiconductor arrangement 200 at various stages of fabrication, in accordance with some embodiments. FIGS. 13-15 include a simplistic plan view showing where various cross-sectional views are taken. Referring to FIG. 13, the view X-X is a cross-sectional view taken through the semiconductor arrangement 100 in a direction corresponding to a gate length direction through a fin or nano-sheet, the view Y1-Y1 is a cross-sectional view taken through the semiconductor arrangement 100 in a direction corresponding to a gate width direction through a gate structure, and the view Y2-Y2 is a cross-sectional view taken through the semiconductor arrangement 100 in a direction corresponding to a gate width direction through a source/drain region. Not all aspects of the processing shown in the cross-sectional views will be depicted in the plan view. The semiconductor arrangement 200 in FIG. 13 starts with the semiconductor arrangement 100 illustrated in FIG. 2.

Referring to FIG. 13, a first semiconductor material 205 is formed in the recess 150, in accordance with some embodiments. In some embodiments, a first deposition process is performed to form the first semiconductor material 205 in the recess 150. The first semiconductor material 205 is adjacent the first portion 135 of the fin 110. In some embodiments, the first semiconductor material 205 extends over the interface 115. In some embodiments, an uppermost surface of the first semiconductor material 205 is positioned at height higher than the interface 115. In some embodiments, a height 207 of the first semiconductor material 205 from the bottom of the recesses 150 to an upper surface of the first semiconductor material 205 is about 10-30 nm. According to some embodiments, the first semiconductor material 205 comprises a stress-inducing material that exerts stress on the first portions 135 of the fin 110. In some embodiments, the first semiconductor material 205 exerts about at least 1.5 GPa.

In some embodiments, the first semiconductor material 205 comprises a silicon alloy having an alloy species that affects a lattice constant of the first semiconductor material 205 relative to a lattice constant of the material forming the semiconductor layer 105 and the fin 110. In some embodiments, the alloy species comprises germanium, tin, or other suitable material that causes the first semiconductor material 205 to have a larger lattice constant than the material forming the semiconductor layer 105 and the fin 110 and generating a compressive stress on the first portions 135 of the fin 110. In some embodiments, the first semiconductor material 205 comprises InAs, GaAs, InGaAs, or other suitable material. In some embodiments, the alloy species comprises carbon or other suitable material that causes the first semiconductor material 205 to have a smaller lattice constant than the material forming the semiconductor layer 105 and the fin 110 and generating a tensile stress on the first portions 135 of the fin 110. In some embodiments, the alloy species concentration is between about 20% and 60% by elemental composition.

Referring to FIG. 14, a second semiconductor material 210 is formed in the recess 150 over the first semiconductor material 205, in accordance with some embodiments. In some embodiments, a second deposition process is performed to form the second semiconductor material 210 in the recess 150. In some embodiments, the deposition process comprises an epitaxial growth process. According to some embodiments, the second semiconductor material 210 defines a portion of a source/drain region. In some embodiments, an upper surface of the second semiconductor material 210 extends beyond an upper surface of the fin 110 and an upper surface of the isolation structure 117. In some embodiments, the first semiconductor material 205 is undoped, and the second semiconductor material 210 comprises a dopant. In some embodiments, forming the first semiconductor material 205 to extend over the interface 115 reduces leakage as compared to a situation where the first semiconductor material 205 does not extend over the interface 115. In some embodiments, the second semiconductor material 210 comprises a silicon alloy. In some embodiments, the silicon alloy of the first semiconductor material 205 comprises the same silicon alloy as the second semiconductor material 210. In some embodiments, a concentration of the alloy species in the first semiconductor material 205 is different than the concentration of the alloy species in the second semiconductor material 210. In some embodiments, the first semiconductor material 205 and the second semiconductor material 210 comprise silicon germanium.

Referring to FIG. 15, a dielectric layer 170 is formed over the second semiconductor material 210. In some embodiments, a deposition process is performed to form the dielectric layer 170. In some embodiments, the dielectric layer 170 is planarized to expose the cap layer 125. In some embodiments, the dielectric layer 170 comprises silicon dioxide or a low-k material. In some embodiments, the dielectric layer 170 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. The materials for the dielectric layer 170 comprise at least one of Si, O, C, or H, such as SiCOH and SiOC, or other suitable materials. Organic material such as polymers may be used for the dielectric layer 170. In some embodiments, the dielectric layer 170 comprises one or more layers of a carbon-containing material, organo-silicate glass, a porogen-containing material, or combinations thereof. The dielectric layer 170 may also comprise nitrogen in some embodiments. The dielectric layer 170 may be formed by using, for example, at least one of plasma-enhanced chemical vapor deposition (PECVD), low pressure CVD (LPCVD), atomic layer CVD (ALCVD), or a spin-on technology. In some embodiments where the dielectric layer 170 is formed using PECVD, the dielectric layer 170 is deposited at a substrate temperature in a range of about 25° C. to about 400° C. and at a pressure of less than 100 Torr.

According to some embodiments, the processes illustrated in FIGS. 8-12 are performed on the semiconductor arrangement 200 to remove the gate structures 120 and form replacement gate structures 180, to form contact openings 190 exposing the first semiconductor material 165, and to form source/drain contacts 195 in the contact openings 190. In some embodiments, additional contacts are formed in an additional dielectric layer to contact selected portions of the replacement gate structures 180 or the source/drain contacts 195.

According to some embodiments, the gate structure 120, fin 110, and second semiconductor material 210 comprise portions of a transistor. The type of stress generated by the first semiconductor material 205 depends on the conductivity type of the transistor. Exerting compressive stress on the first portions 135 of the fin 110 increases hole mobility and increases performance of P-type transistors. Exerting tensile stress on the first portions 135 of the fin 110 increases carrier mobility and increases performance of N-type transistors.

In some embodiments, the depth 154 of the recesses 150 and the height 157 of the dielectric material 155 or the height 207 of the first semiconductor material 205 is selected to provide a sufficient amount of stress-inducing material. In some embodiments, if the depth of the recesses 150 is too deep, warping of the fins 110 may occur. In some embodiments, if the height 157 of the dielectric material 155 or the stress-inducing material 160, or the height 207 of the first semiconductor material 205 from the bottom of the recesses 150 is too high, increased resistance may occur in the fins 110, reducing performance.

According to some embodiments, the formation of a stress-inducing material in a recess that extends into a semiconductor layer lower than the fin allows stress to be applied to a channel region of a transistor device. In some embodiments, the stress-inducing material is a dielectric material. In some embodiments, the stress-inducing material is a silicon alloy material.

In some embodiments, the stress-inducing material generates compressive stress to increase hole mobility. In some embodiments, the stress-inducing material generates tensile stress to increase electron mobility. The type of stress generated by the stress-inducing material may be determined by the type of stress-inducing material employed.

In some embodiments, a method for forming a semiconductor arrangement includes forming a fin over a semiconductor layer. A gate structure is formed over a first portion of the fin. A second portion of the fin adjacent to the first portion of the fin and a portion of the semiconductor layer below the second portion of the fin are removed to define a recess. A stress-inducing material is formed in the recess. A first semiconductor material is formed in the recess over the stress-inducing material. The first semiconductor material is different than the stress-inducing material.

In some embodiments, a method for forming a semiconductor arrangement includes forming a fin over a semiconductor layer. A first portion of the fin and a first portion of the semiconductor layer are removed to define a first recess. A second portion of the fin and a second portion of the semiconductor layer are removed to define a second recess. A stress-inducing material is formed in the first recess and the second recess. A first semiconductor material is formed in the first recess and the second recess over the stress-inducing material. The first semiconductor material is different than the stress-inducing material. The first semiconductor material in the first recess defines a first source/drain region. The first semiconductor material in the second recess defines a second source/drain region.

In some embodiments, a semiconductor arrangement includes a fin over a semiconductor layer. A gate structure is over a portion of the fin and over a portion of the semiconductor layer. A stress-inducing material is adjacent the portion of the fin and the portion of the semiconductor layer. A first semiconductor material is adjacent the portion of the fin and over the stress-inducing material, wherein the first semiconductor material is different than the stress-inducing material.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a fin over a semiconductor layer;
   a gate structure over a portion of the fin and over a portion of the semiconductor layer;
   a stress-inducing material adjacent the portion of the fin and the portion of the semiconductor layer;
   a first semiconductor material overlying the stress-inducing material such that the stress-inducing material is between the first semiconductor material and the semiconductor layer and spaces the first semiconductor material apart from the semiconductor layer, wherein:
   the first semiconductor material is different than the stress-inducing material, and
   the first semiconductor material contacts a sidewall of the fin; and
   an isolation structure, wherein an uppermost surface of the stress-inducing material is above an uppermost surface of the isolation structure.

2. The semiconductor arrangement of claim 1, wherein the stress-inducing material exerts at least 1.5 GPa of compression stress on the portion of the fin.

3. The semiconductor arrangement of claim 1, wherein a distance between a bottommost surface of the stress-inducing material and an uppermost surface of the fin is 60-90 nm.

4. The semiconductor arrangement of claim 1, wherein a distance between a bottommost surface of the stress-inducing material and a bottommost surface of the fin is 20-50 nm.

5. The semiconductor arrangement of claim 1, wherein a distance between a bottommost surface of the fin and the uppermost surface of the stress-inducing material is less than 10 nm.

6. The semiconductor arrangement of claim 1, wherein the stress-inducing material is a porous material configured to shrink upon application of heat.

7. The semiconductor arrangement of claim 1, wherein the first semiconductor material is an epitaxial growth.

8. The semiconductor arrangement of claim 1, wherein an uppermost surface of the first semiconductor material is above an uppermost surface of the fin.

9. The semiconductor arrangement of claim 1, wherein the first semiconductor material defines a source/drain region of the semiconductor arrangement.

10. The semiconductor arrangement of claim 1, comprising a contact overlying the first semiconductor material.

11. The semiconductor arrangement of claim 1, comprising a contact contacting the first semiconductor material.

12. The semiconductor arrangement of claim 1, wherein the stress-inducing material comprises a second semiconductor material having a lattice constant that is larger than a lattice constant of the semiconductor layer.

13. The semiconductor arrangement of claim 1, wherein the stress-inducing material comprises a second semiconductor material having a lattice constant that is larger than a lattice constant of the fin.

14. The semiconductor arrangement of claim 1, wherein:
   the stress-inducing material has a first concentration of an alloy species,
   the first semiconductor material has a second concentration of the alloy species, and
   the second concentration is different than the first concentration.

15. A semiconductor arrangement, comprising:
   a fin over a semiconductor layer;

a first gate structure over a first portion of the fin and over a first portion of the semiconductor layer;

a second gate structure over a second portion of the fin and a second portion of the semiconductor layer;

a stress-inducing material between the first portion of the fin and the second portion of the fin;

a first semiconductor material overlying the stress-inducing material such that the stress-inducing material is between the first semiconductor material and a third portion of the semiconductor layer underlying the stress-inducing material so as to space the first semiconductor material apart from the third portion of the semiconductor layer; and an isolation structure contacting a sidewall of the first semiconductor material, wherein the stress-inducing material and the isolation structure each intersect a same plane extending parallel to a top surface of the semiconductor layer.

16. The semiconductor arrangement of claim 15, wherein the stress-inducing material is a dielectric material.

17. The semiconductor arrangement of claim 15, wherein the stress-inducing material is a porous material configured to shrink upon application of heat.

18. A semiconductor arrangement, comprising:
a fin over a semiconductor layer;
a gate structure over a portion of the fin and over a portion of the semiconductor layer;
a stress-inducing material adjacent the portion of the fin and the portion of the semiconductor layer, wherein the stress-inducing material comprises a porous dielectric material configured to shrink upon application of heat; and
a first semiconductor material overlying the stress-inducing material such that the stress-inducing material is between the first semiconductor material and the semiconductor layer so as to space the first semiconductor material apart from the semiconductor layer, wherein:
the first semiconductor material is different than the stress-inducing material, and
the first semiconductor material contacts a sidewall of the fin.

19. The semiconductor arrangement of claim 18, comprising an isolation structure over the semiconductor layer, wherein the stress-inducing material is in contact with the isolation structure.

20. The semiconductor arrangement of claim 19, wherein the first semiconductor material is in contact with the isolation structure.

* * * * *